United States Patent
Hasegawa et al.

(10) Patent No.: US 7,162,671 B2
(45) Date of Patent: Jan. 9, 2007

(54) SEMICONDUCTOR INTEGRATED CIRCUIT DEVICE, METHOD OF TESTING SEMICONDUCTOR INTEGRATED CIRCUIT DEVICE AND METHOD OF MANUFACTURING SEMICONDUCTOR INTEGRATED CIRCUIT DEVICE

(75) Inventors: Masatoshi Hasegawa, Ome (JP); Shuichi Miyaoka, Hanno (JP); Hiroshi Akasaki, Ome (JP); Masahiro Katayama, Maebashi (JP)

(73) Assignees: Hitachi, Ltd., Tokyo (JP); Hitachi ULSI Systems Co. Ltd., Tokyo (JP)

( * ) Notice: Subject to any disclaimer, the term of this patent is extended or adjusted under 35 U.S.C. 154(b) by 0 days.

(21) Appl. No.: 10/918,421

(22) Filed: Aug. 16, 2004

(65) Prior Publication Data
US 2005/0018461 A1   Jan. 27, 2005

Related U.S. Application Data

(62) Division of application No. 10/058,787, filed on Jan. 30, 2002, now Pat. No. 6,794,678.

(30) Foreign Application Priority Data
Feb. 1, 2001   (JP)   ............................. 2001-025227

(51) Int. Cl.
*G11C 29/00*   (2006.01)

(52) U.S. Cl. .................................................... 714/718

(58) Field of Classification Search ................ 714/718, 714/719, 710, 711; 365/200, 201
See application file for complete search history.

(56) References Cited

U.S. PATENT DOCUMENTS

| | | | |
|---|---|---|---|
| 5,805,514 A * | 9/1998 | Iwakiri | 365/201 |
| 5,892,776 A | 4/1999 | Kumakura | |
| 6,034,904 A | 3/2000 | Kuromiya et al. | |
| 6,058,056 A | 5/2000 | Beffa et al. | |
| 6,061,285 A * | 5/2000 | Tsukikawa | 365/201 |
| 6,104,651 A | 8/2000 | Cowles et al. | |
| 6,178,532 B1 * | 1/2001 | Pierce et al. | 714/718 |
| 6,252,820 B1 | 6/2001 | Nakamura | |
| 6,269,036 B1 | 7/2001 | Shubat | |
| 6,297,997 B1 | 10/2001 | Ohtani et al. | |
| 6,496,947 B1 * | 12/2002 | Schwarz | 714/30 |

* cited by examiner

*Primary Examiner*—James C Kerveros
(74) *Attorney, Agent, or Firm*—Reed Smith LLP; Stanley P. Fisher, Esq.; Juan Carlos A. Marquez, Esq.

(57) ABSTRACT

Inputs of a control circuit are connected to a terminal to which an external operation control signal is supplied and a terminal to which a timing signal used exclusively for testing is supplied, and the control circuit is made controllable such that, in a test mode, a state of an internal operation control signal is changed in response to a change of a state of the external operation control signal, and the internal operation control signal is changed in response to the timing exclusively used for testing, whereas, in a normal operation mode, the state of the internal operation control signal is changed in response to the change of the state of the external operation control signal, and the internal operation control signal is changed in response to the change of the external operation control signal.

4 Claims, 12 Drawing Sheets

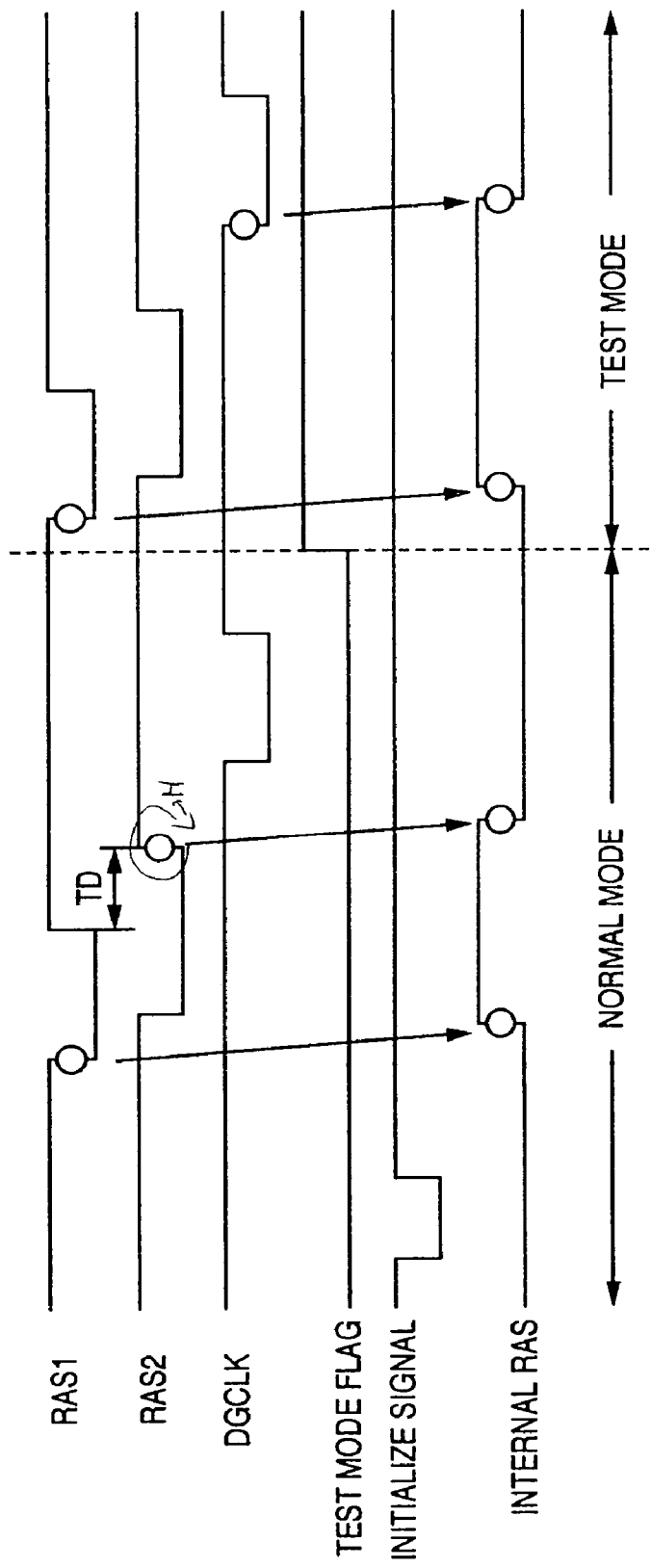

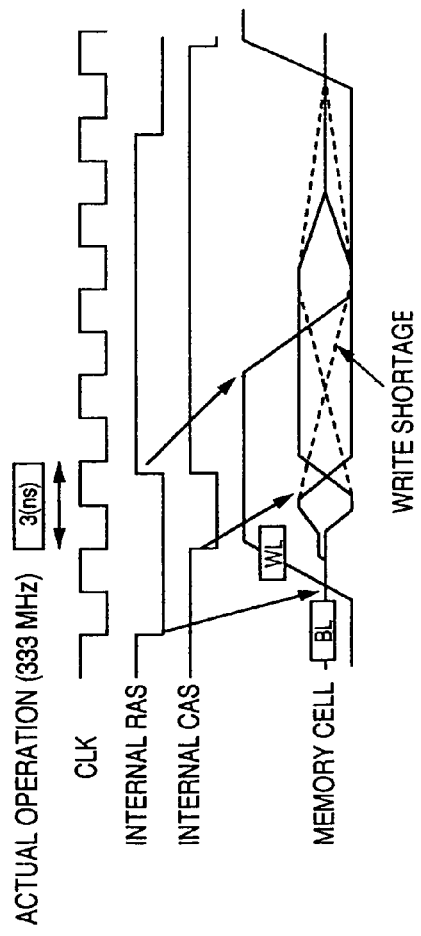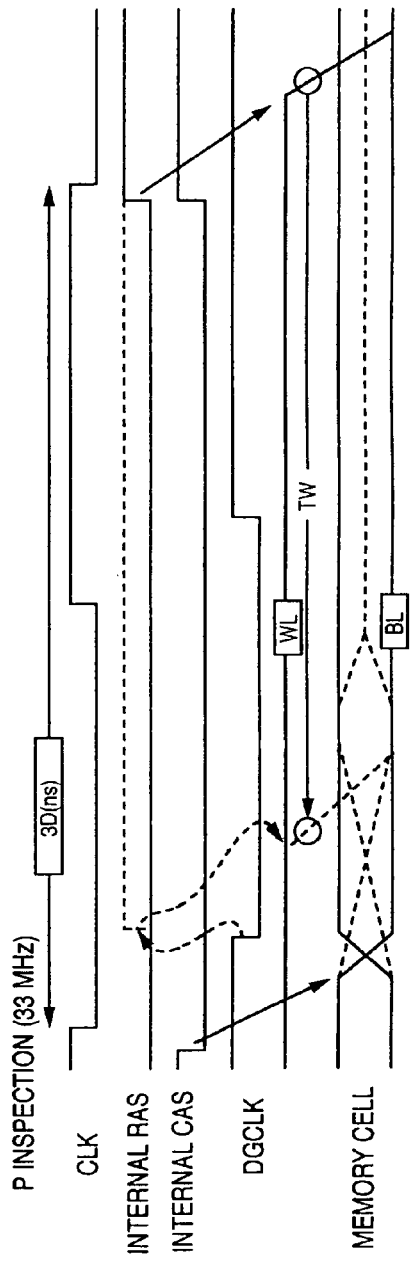

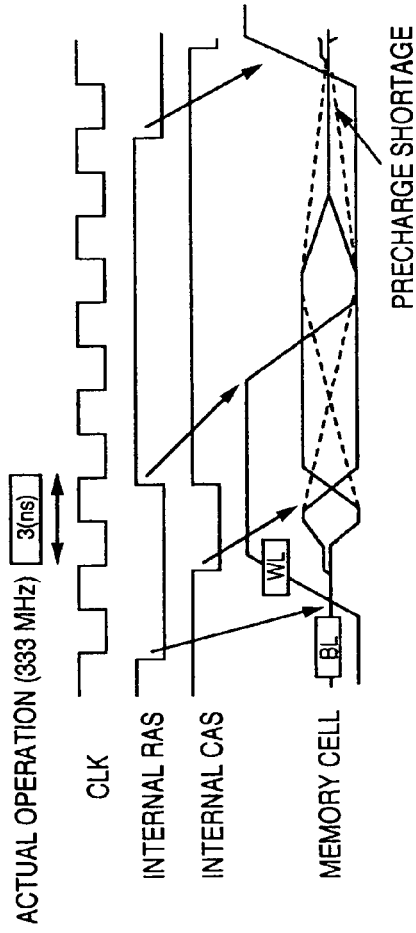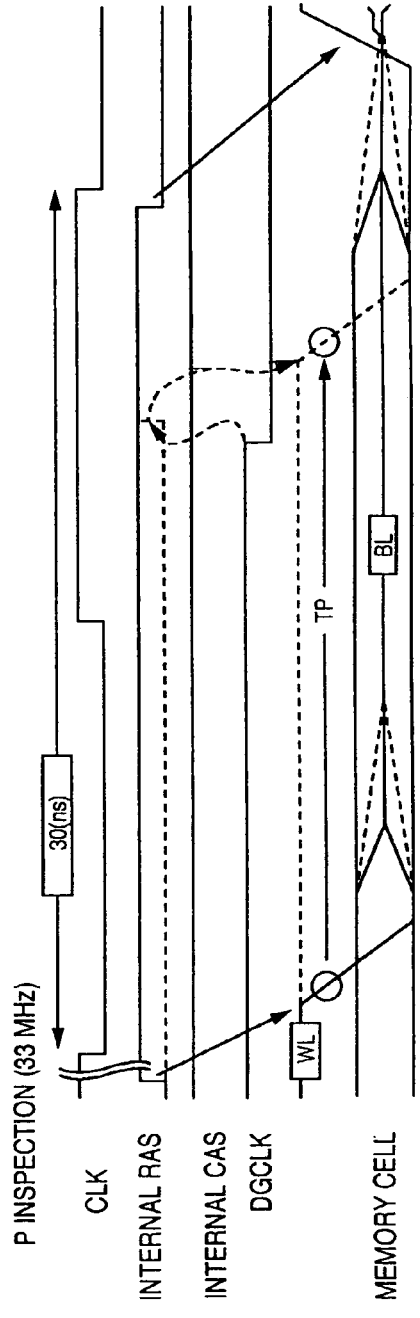

SEMICONDUCTOR INTEGRATED CIRCUIT DEVICE, METHOD OF TESTING SEMICONDUCTOR INTEGRATED CIRCUIT DEVICE AND METHOD OF MANUFACTURING SEMICONDUCTOR INTEGRATED CIRCUIT DEVICE

This application is a divisional of U.S. Ser. No 10/058,787 filed Jan. 30, 2002 now U.S. Pat. No. 6,794,678. Priority is claimed based on U.S. Ser. No. 10/058,787 filed Jan. 30, 2002, which claims priority to Japanese Patent Application No. 2001-025227 filed on Feb. 1, 2001.

BACKGROUND OF THE INVENTION

The present invention relates to a semiconductor integrated circuit device, a method of testing a semiconductor integrated circuit device and a method of manufacturing a semiconductor integrated circuit device. More particularly, the present invention concerns an effective technique for use in a technique for determining a write failure and a precharge failure in a high-speed operating dynamic random access memory (RAM) configured as a semiconductor integrated circuit device, by using a low-speed testing apparatus, for example.

A dynamic RAM configured as a semiconductor integrated circuit device is tested by application of an appropriate operation control signal and a data signal and by reference to output data. In cases where it is necessary to confirm the operating speed of the dynamic RAM and where it is necessary to confirm an operation timing margin, testing is performed after periods of synchronization signals which are called a row address strobe (RAS) signal and a column address strobe (CAS) signal are appropriately set for testing. Namely, a period operation required for operation for selecting/nonselecting word lines in the RAM, amplifying operation of sense amplifiers, and precharging operation of bit lines, and the like vary according to variations in the fabrication of the RAM. Testing as to whether or not the variations of the period required for various appropriate operation fall within an allowable range becomes possible by the appropriately setting the synchronization signals.

Development of semiconductor integrated circuit device technologies in recent years has been remarkable, and increasingly highly sophisticated functions and higher-speed operation have been made possible. As for the dynamic RAMs as well, which are configured as semiconductor integrated circuit devices, those operating at a high speed at a frequency in the neighborhood of 100 MHz or below have become necessary and have been made available. Testing apparatus or testers which can be realistically used for practical purposes for the dynamic RAMs capable of high-speed operation of that kind operate at relatively low speeds with the clock operation of about 30 MHz.

SUMMARY OF THE INVENTION

Prior to the invention, the present inventors studied the possibility of high-speed testing of the RAM under the condition in which a low-speed testing apparatus is used. The technique of interest which was studied concerned a technique in which a portion of the internal timing control configuration of the memory is made shiftable from the configuration of responding to the normal level transition of a synchronization signal such as the RAS signal to the configuration of responding to the level transition in the opposite direction only during testing (i.e., a shift of the edge trigger is effected), and in which, during testing, the internal circuit of the memory is operated by a synchronization signal with an apparently short pulse width in combination with a pulse-width setting function or a pulse-duty ratio changing mechanism in a testing apparatus. In the case of a dynamic RAM whose operating speed is not very high such as 100 MHz or less, through the above-described studied technique, by using the aforementioned clock signal of about 30 MHz it becomes possible to conduct an evaluation of response characteristics of the internal circuit, i.e., those equivalent to a case in which the circuit is operated at the aforementioned 100 MHz, by the above-described control of the duty of the clock signal in the testing apparatus. That is, the evaluation of the high-speed operation of the RAM becomes possible.

According to this studied technique, however, the test of the dynamic RAMs for which even higher-speed operation is required becomes difficult. For example, in the case of a high-speed operating DRAM whose operating frequency is increased to about 400 MHz or thereabouts, the duty of the clock signal supplied from the above-described testing apparatus must be made extremely small, and the pulse duty becomes destroyed in a signal transmission path leading from the testing apparatus to the memory circuit, thereby making it impossible to reliably make an evaluation equivalent to that of a case in which the circuit is operated at the aforementioned 400 MHz or thereabouts. For this reason, the screening yield in the probing process declines, and wastes occur in the process ranging from assembly to screening with respect to the chips which essentially prove to be defective.

The difficulty of evaluation of the high-speed operating DRAM will be described below with reference to FIG. 12 illustrating an equivalent circuit of a memory cell portion and a sense amplifier portion of a DRAM. It should be noted that, in the high-speed operation of the dynamic RAM, effects due to variations of parasitic resistance which is present in the memory cell are unnegligible. Accordingly, in FIG. 12, the parasitic resistance which is generally not illustrated in drawings as it can be negligible is also illustrated. In the write cycle of the DRAM, a bit line (BL) in which two signals, a Y select signal (YS) and a write select signal (WS) are asserted is connected to a write I/O (WIO) to invert the bit line, and the bit line is made to undergo a full amplitude by the sense amplifier. Further, where a storage node of the memory cell has assumed the same potential as that of the bit line, the word line (WL) is made to fall to complete writing.

In the memory cell, as shown in the drawing, large parasitic resistances are present at a bit-line contact hole (BLCT) for connecting the bit line and a transfer MOSFET and a storage node contact hole (SNCT) for connecting a storage node and the transfer MOSFET, and faulty bits (memory cells) having even greater parasitic resistances are present in process variations. Therefore, unless these faulty bits are detected and remedied in a probing inspection (hereafter, P inspection), a decline in the screening yield after assembly results.

In addition, upon completion of writing, a precharge signal (PCH) is asserted, and the precharging of the bit line is effected in preparation for ensuing reading. Here, when the drive capability is weak due to the contact resistance of the precharging MOSFET and variations in Vth, its bit line fails to be fully precharged before the next read cycle, and the next word line is risen in a state in which the potential remains at the bit line. Hence, the amount of bit line signal which is read from the selected memory cell is destroyed, which acts an input offset for the sense amplifier, so that a read failure occurs. Unless such a bit line failure is remedied at the time of the P inspection, a decline in the screening yield after assembly results.

An object of the invention is to provide a semiconductor integrated circuit device which enables a high-speed operation test with high reliability by a simple configuration as well as a testing method therefor. Another object of the invention is to provide a method of manufacturing a semiconductor integrated circuit device which realizes the improvement of the screening yield by a simple configuration. The above and other objects and novel features of the invention will become more apparent from the description of the specification and the appended drawings.

In accordance with one aspect of the invention, there is provided a semiconductor integrated circuit device comprising: an internal circuit whose state of operation is controlled in response to an internal operation control signal; and a control circuit for forming the internal operation control signal, wherein the control circuit has its inputs connected to a terminal to which an external operation control signal is supplied and a terminal to which a timing signal used exclusively for testing is supplied, the control circuit being capable of providing control between a test mode and a normal operation mode, wherein, in the test mode, the internal operation control signal is changed from a first state of control to a second state of control in response to a change of the external operation control signal from a first state to a second state, and the internal operation control signal is changed to the first state of control in response to the timing exclusively used for testing, and wherein, in the normal operation mode, the internal operation control signal is changed from the first state of control to the second state of control in response to the change of the external operation control signal from the first state to the second state, and the internal operation control signal is changed to the first state of control in response to the change of the external operation control signal to the first state.

In accordance with another aspect of the invention, there is provided a method of testing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, comprising the steps of: setting a frequency of the timing signal at the time of test operation by a testing apparatus to a level lower than that at the time of normal memory operation in correspondence with the performance of the testing apparatus; and changing a period of operation by the operation control signal by combining the timing signal at the time of the test operation with a timing signal used exclusively for testing so as to test response characteristics of the memory circuit.

In accordance with still another aspect of the invention, there is provided a method of manufacturing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, the memory circuit having a defect remedy circuit, comprising: a first step of preparing a semiconductor integrated circuit substrate on which the memory circuit and the defect remedy circuit are formed; a second step of testing response characteristics of the memory circuit by a testing apparatus by setting a frequency of the timing signal to a level lower than that at the time of normal operation in correspondence with the performance of the testing apparatus, by controlling a period of operation of the memory circuit through a combination of the timing signal and a timing signal used exclusively for testing, and by controlling the period of operation; a third step of determining a portion of the memory circuit whose defect is to be remedied on the basis of a result of the testing of the response characteristics; and a fourth step of remedying by the defect remedy circuit the portion whose defect is to be remedied and which has been determined in the third step.

BRIEF DESCRIPTION OF THE DRAWINGS

FIG. 7 is a timing chart for explaining the operation of the internal RAS generating circuit shown in FIG. 6;

FIGS. 8A and 8B are waveform diagram of the operation for a write failure test for explaining the invention;

FIGS. 9A and 9B are waveform diagram of the operation for a bit-line precharge time failure test for explaining the invention;

DESCRIPTION OF THE EMBODIMENTS

Figure 1:
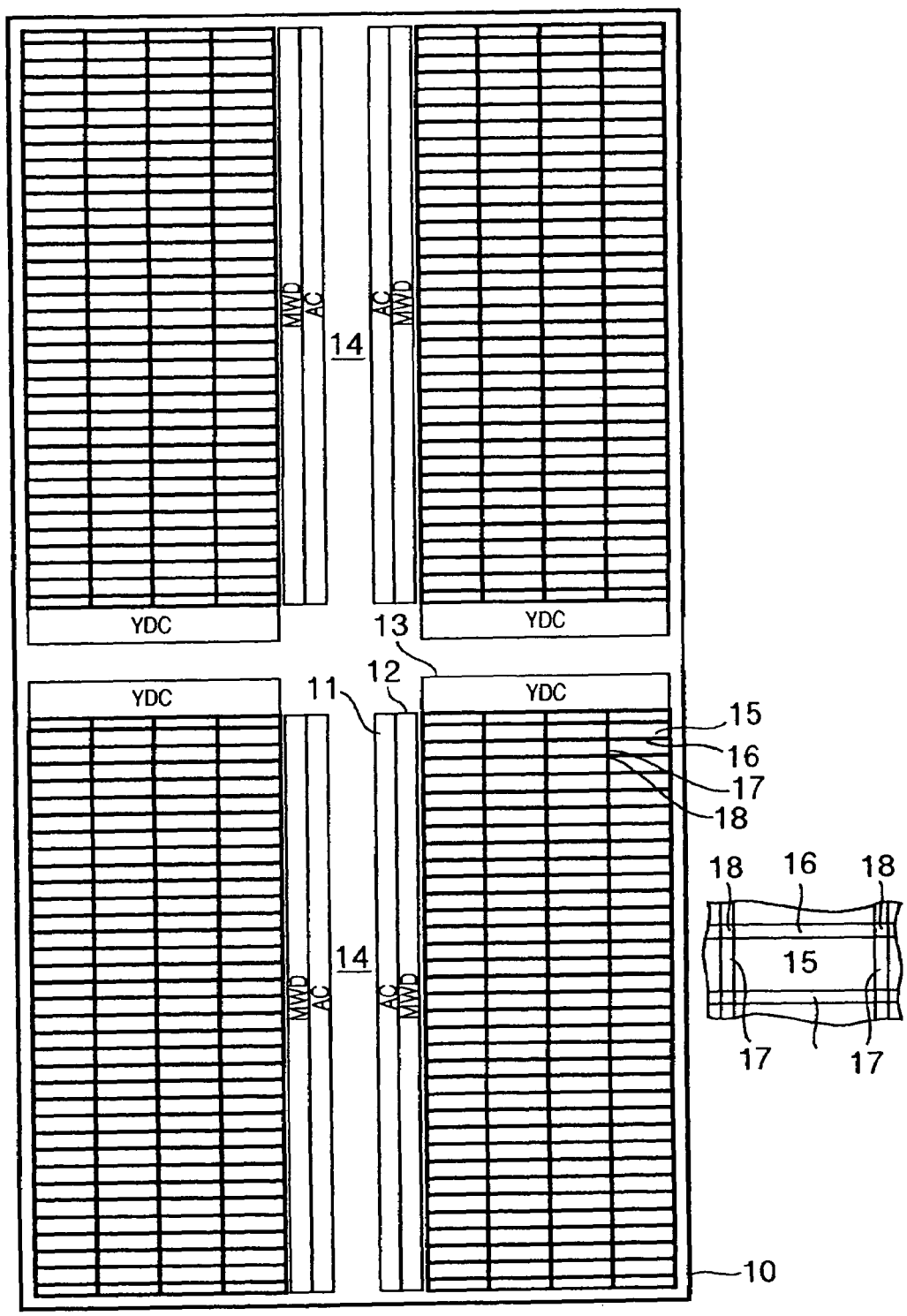
FIG. 1 is a schematic diagram illustrating the layout of an embodiment of a dynamic RAM to which the invention is applied.

FIG. 1 shows a schematic diagram of a layout of an embodiment of a dynamic RAM to which the invention is applied. The drawing is illustrated such that principal portions of various circuit blocks making up the dynamic RAM to which the invention is applied can be understood. The illustrated dynamic RAM is formed on a single semiconductor substrate such as a monocrystal silicon substrate by a known technique of manufacturing a semiconductor integrated circuit such that the dynamic RAM as a whole forms one semiconductor chip or a memory chip 10.

In this embodiment, the entire semiconductor chip 10 is divided into four memory arrays although the number of divisions is not particularly restricted. The four memory arrays are arranged on the left- and right-hand sides with respect to the longitudinal direction of the semiconductor chip 10. Although not shown for avoiding the complication of the drawing, an address input circuit, a data input/output circuit, an input/output interface circuit consisting of rows of bonding pads, a power supply circuit including a step-up circuit and a step-down circuit, and so forth are provided in a central portion 14. A memory array control (AC) circuit 11 and a main word driver (MWD) 12 are arranged in respective portions contiguous to the memory arrays on both sides of these central portions 14. The memory array control circuit 11 consists of a control circuit and a main amplifier for driving subword select lines and sense amplifiers. For each of the four memory arrays arranged in units of two horizontal arrays and two vertical arrays with respect to the semiconductor chip as described above, a column decoder area (YDC) 13 is provided in a vertically central portion with respect to the longitudinal direction.

The main word driver 12 forms a select signal for a main word line extending in such a manner as to penetrate one memory array corresponding to the main word driver 12. A driver for a subword select line for subword selection is also provided in the area of the main word driver 12, and extends in parallel with the main word line to form an address signal for a subword select line. The column decoder 13 forms an address signal for a column select line extending in such a manner as to penetrate one memory array corresponding to the column decoder 13.

Each of the above-described memory arrays consists of a plurality of memory cell arrays (hereafter referred to as subarrays) 15. FIG. 1 also shows together with the semiconductor chip 10 an enlarged view, on the side of the chip 10, of the subarray 15 in the chip 10. As shown in the enlarged view, the subarray 15 is formed by being surrounded by sense amplifier areas 16 and subword driver areas 17. A portion of intersection of the sense amplifier area 16 and the subword driver area 17 is set as a cross area 18. The sense amplifier which is provided in the sense amplifier area 16 is formed by a latch circuit of a CMOS structure, and a so-called one-intersection-point method is adopted in which a signal on a complementary bit line extending to the left and the right with such a sense amplifier set as a center is amplified.

One memory sell array (subarray) 15 shown in the enlarged view has 512 subword lines and 1,024 complementary bit lines on one side (or data lines) perpendicular thereto, although their numbers are not particularly restricted. In one memory array described above, 32 subarrays 15 are provided in the bit-line direction for normalization and 2 subarrays 15 for reference in such a manner as to extend in the direction of extension of the bit line. In the subarray 15, since a pair of complementary bit lines are provided with the sense amplifier area 16 set as a center, so that, when viewed in the direction of extension of the bit line, the bit line is virtually divided into 16 segments by the subarrays 15. In addition, four subarrays 15 are provided in the direction of extension of the word line. Consequently, when viewed in the direction of extension of the word line, the subword line is divided into four segments by the subarrays 15.

Since 1,024 bit lines are provided in one subarray 15, memory cells of an approximately 4 K portion are connected in the word-line direction. Since 512 subword lines are provided, memory cells of a 512×32=16 K portion are connected in the bit-line direction. Consequently, one memory array is provided with a storage capacity of 4 K×16 K=64 M bits, so that the memory chip 10 as a whole is provided with a storage capacity of 4×64 M=256 M bits by the four memory arrays.

In the present specification, the term "MOS" can be understood as referring to a metal oxide semiconductor structure in a simplified form. However, MOS devices which are generally referred to as such in recent years also include those in which the metal in essential portions of the semiconductor device is replaced by a nonmetallic electrical conductor such as polysilicon and in which the oxide is replaced by another insulator. The CMOS has also come to be understood as having a broad technological implication corresponding to the change in grasping the MOS devices as described above. MOSFETs have also come to be understood to have not a narrow meaning but in practical terms a meaning including structures in a broad sense which can be grasped as insulated-gate field-effect transistors. The CMOS, the MOSFET, and the like in the invention are thus to be construed in conformity with the generally adopted appellations.

Figure 2A:
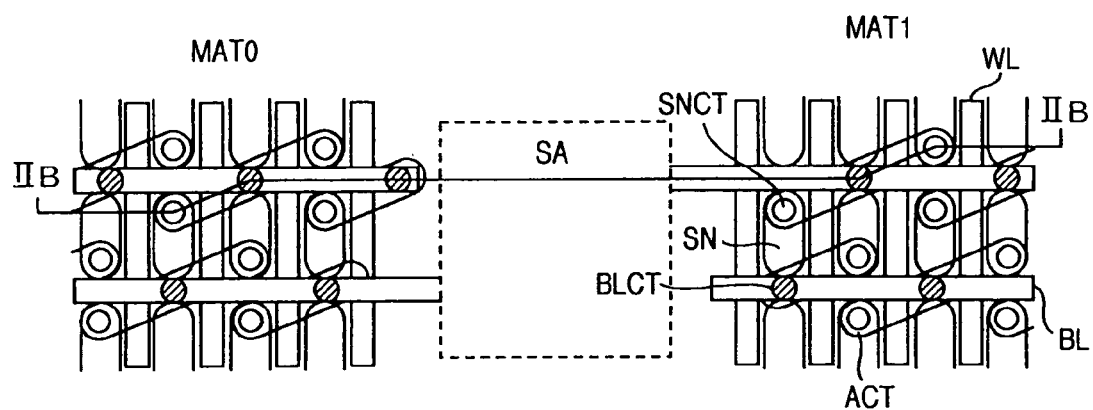
FIGS. 2A and 2B are explanatory diagrams of an embodiment of memory cells in the dynamic RAM in accordance with the invention.
Figure 2B:
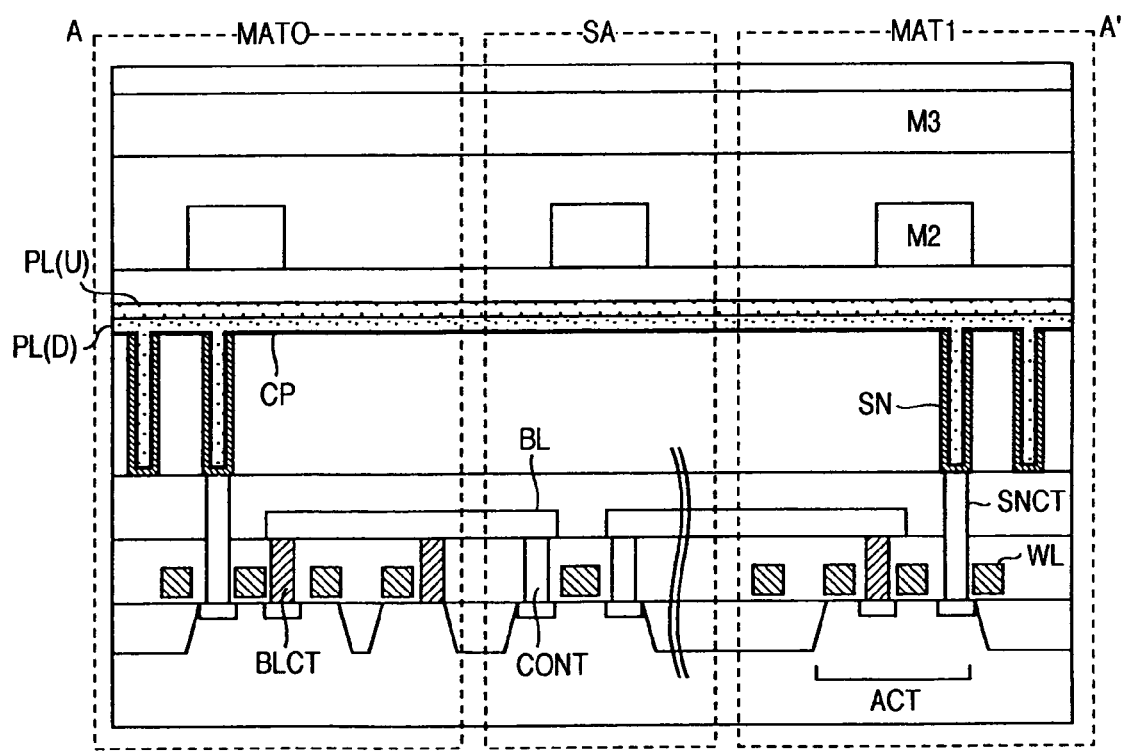

FIGS. 2A and 2B show explanatory diagrams of an embodiment of memory cells in the dynamic RAM in accordance with the invention. FIG. 2A shows a planar layout of memory cell arrays including two subarrays MAT0 and MAT1 described above, and FIG. 2B shows a cross-sectional structure as viewed along line IIB—IIB in FIG. 2A. In the drawings, the layout and cross section of a sense amplifier SA area provided between MAT0 and MAT1 are omitted.

ACT denotes an active region of the MOSFET, and SNCT denotes a plug-like contact for connecting a storage node SN of the memory cell and a source-drain diffused layer, corresponding to the storage node SN, of the MOSFET formed in the active region ACT. BLCT denotes a plug-like contact for connecting a bit line BL and the source-drain diffused layer, corresponding to the storage node SN, of the MOSFET formed in the active region ACT. CP denotes a capacitance insulating film of a storage capacitor.

In the technology of this embodiment, the bit line BL is formed by a first metal layer M1. A subword line WL is formed by a first polysilicon layer FG. The aforementioned contacts SCNT and BLCT are selected from tungsten, polysilicon, and the like, and are set to very fine dimensions so that a large number of memory cells can be provided in a limited area. Junction areas between, on the one hand, the contacts SNCT and BLCT and, on the other hand, regions and layers to which they are to be electrically connected have the possibility of changing relatively greatly due to alignment errors in photolithographic technology, dimensional changes in fabrication, and the like. For this reason, the contacts SNCT and BLCT often have relatively large parasitic resistances and relatively large process variations. Faulty write bits (faulty memory cells) occur due to such parasitic resistances in the contacts SNCT and BLCT, as will be described later.

In the capacitors for the plurality of memory cells in the subarray MAT0, respective one electrodes are made electrically common by a plate electrode PL such as the one shown in FIG. 2B. Similarly, respective one electrodes of the plurality of capacitors in the subarray MAT1 are also made electrically common by the plate electrode PL. Although the arrangement is not particularly restricted, the plate electrodes PL of the subarrays MAT0 and MAT1 provided on both sides of the sense amplifier SA are not separated on the sense amplifier SA, but are connected by electrodes which make up the plate electrodes PL. Consequently, it becomes possible to substantially reduce the resistance between the plate electrode PL of the subarray MAT0 and the plate electrode PL of the subarray MAT1. A capacity over bitline (COB) structure is adopted for the memory cell. Namely, the storage node SN is provided over the bit line BL. As a result, the plate electrode PL is not cut by the connecting portion BLCT between the bit line BL and the address-selecting MOSFET in the subarrays MAT, and can be formed in a single planar configuration, so that it is possible to reduce the resistance in the plate electrode PL.

Such a technology for establishing low-resistance coupling between the plate electrode PL on the subarray MAT0 side and the plate electrode PL on the subarray MAT1 side deserves particular attention in the dynamic RAM of the structure which is so-called one-intersection-point system or an open-bit-line system. Namely, the reason for this is that variations in the potential which are undesirably imparted to the plate electrode PL on the subarray MAT0 side and variations in the potential which are undesirably imparted to the plate electrode on the subarray MAT1 side through an unwanted coupling capacity during such as the operation of the sense amplifier SA can be suppressed to a relatively low level by the low-resistance coupling between the plate electrodes.

In this embodiment, as shown in FIG. 2B, the plate electrode PL is formed as a laminated structure including PL(D) and PL(U), which makes it possible to lower the sheet resistance value of such a plate electrode PL and s advantageous in lowering noise generated between the plates of MAT0 and MAT1. For example, in a case where a high dielectric film such as BST and $Ta_2O_5$ is used as the capacity insulating film CP of the storage capacitor, if Ru is used for the lower electrode (storage node) SN and the lower layer PL(D) of the upper electrode, it is possible to increase the capacity of the storage capacitor. Since Ru has a low sheet resistance value as compared with the conventionally used polysilicon, it is possible to lower the resistance value of the plate electrode PL.

Further, if W is laminated in this structure as the plate electrode PL(U), it is possible to further lower the resistance value of the plate electrode PL. If the resistance value of the plate electrode PL itself is lowered, the speed with which the noise carried on the plate electrode PL is canceled is made high, and the noise in the plate electrode PL can be thus reduced. Alternatively, TiN may be used as the plate electrode PL(D). In this case as well, advantages similar to those described above can be obtained.

Figure 3:
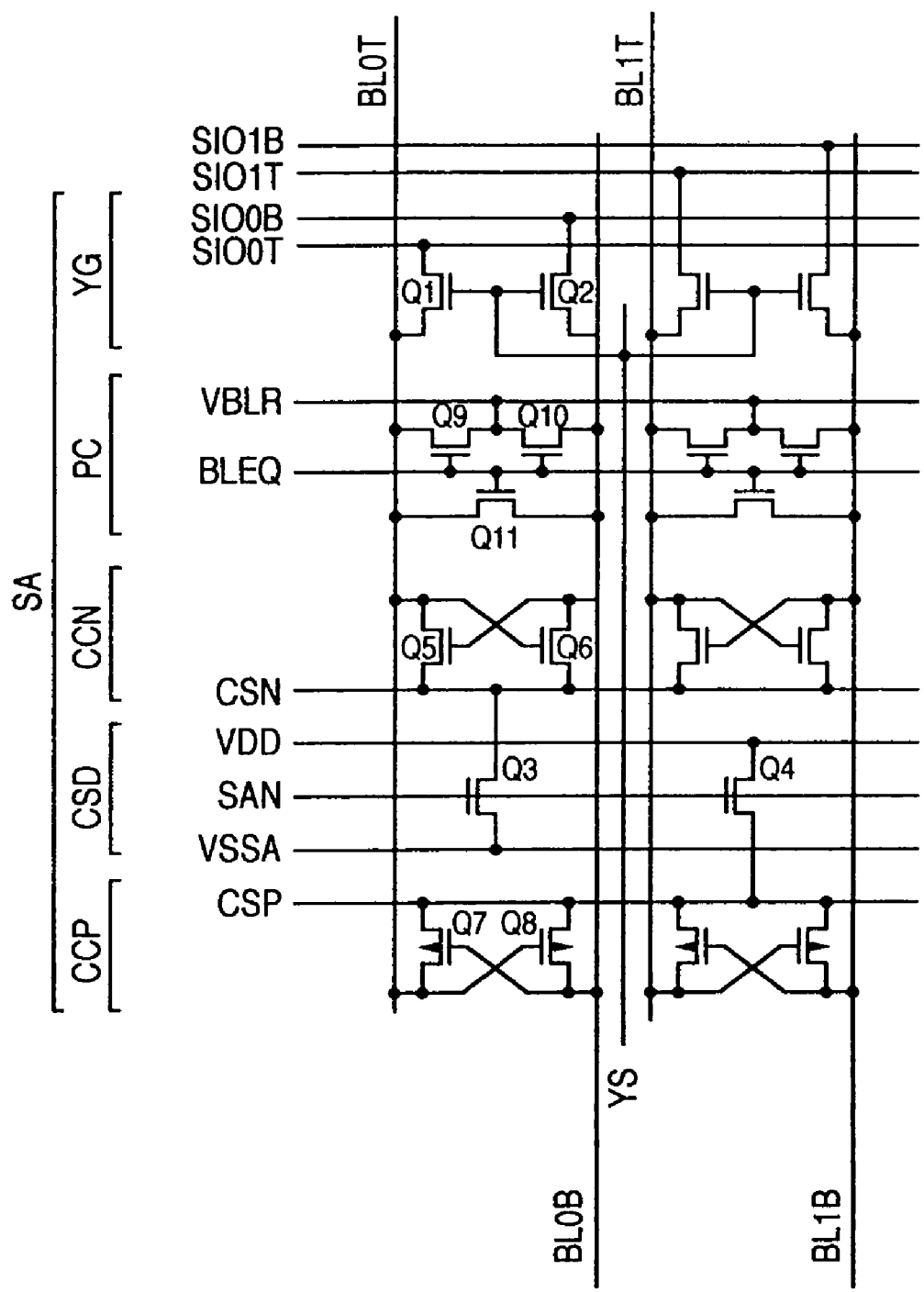
FIG. 3 is a circuit diagram illustrating an example of a sense amplifier portion of the dynamic RAM in accordance with the invention.

FIG. 3 shows a circuit diagram illustrating an example of the sense amplifier portion of the dynamic RAM in accordance with the invention. The sense amplifier SA is configured by a CMOS latch circuit, i.e., a CMOS latch circuit including N-channel amplifier MOSFETs Q5 and Q6 and P-channel amplifier MOSFETs Q7 and Q8 which are set in a latch form by the intersecting connection between gates and drains. The sources of the N-channel MOSFETs Q5 and Q6 are connected to a common source line CSN. The sources of the P-channel MOSFETs Q7 and Q8 are connected to a common source line CSP.

Power switch MOSFETs Q3 and Q4 are respectively connected to the aforementioned common source lines CSN and CSP. Although the arrangement is not particularly restricted, the N-channel power switch MOSFET Q3 arranged in a distributed manner in such a sense amplifier area is provided for the common source line CSN to which the sources of the N-channel amplifier MOSFETS Q5 and Q6 are connected, so as to impart the voltage of a ground-potential supply line VSSA. The N-channel power MOSFET Q4 is provided for the common source line CSP to which the sources of the P-channel amplifier MOSFETs Q7 and Q8 are connected, so as to impart an operating voltage VDD.

A sense amplifier activating signal SAN is supplied to the gates of the N-channel power MOSFETs Q3 and Q4. The high level of SAN is set to the signal level of a stepped-up voltage VPP although this setting is not particularly restricted. In other words, the stepped-up voltage VPP is a voltage stepped up to a level higher than a threshold voltage at the MOSFET Q4 with respect to the aforementioned supply voltage VDD, and the stepped-up voltage VPP is capable of setting the N-channel MOSFET Q4 sufficiently in an on state and of setting the potential at its common source line CSP to the aforementioned supply voltage VDD.

At input/output nodes of the above-described sense amplifier SA, a precharging (equalizing) circuit is provided which consists of an equalizing MOSFET Q11 for shortcircuiting complementary bit lines BL0T and BL0B as well as switching MOSFETs Q9 and Q10 for supplying a half precharging voltage VBLR to the complementary bit lines BL0T and BL0B. A precharging (bit-line equalizing) signal BLEQ is commonly supplied to the gates of these MOSFETs Q9 to Q11.

A driver circuit for forming this precharging signal BLEQ includes a plurality of inverter circuits which, although not shown, are arranged in a distributed manner in the cross areas 18 shown in FIG. 1, and speeds up the rise and fall of the precharging signal BLEQ. In other words, in advance of the word-line select timing at the start of memory access the MOSFETs Q9 to Q11 making up the aforementioned precharging circuit are changed over at high speed through the inverter circuits provided in a distributed manner in the cross areas 18. If the driving capability of the precharging circuit becomes weak due to the contact resistance of the MOSFET Q11 and variations in the threshold voltage Vth, the time required for equalization becomes long, and a precharge failure occurs.

In addition to being connected to the BL0T and BL0B, the pair of input/output nodes of the sense amplifier SA are connected to local (sub) input/output lines SIO (consisting of SIO0T and SIO0BB) extending along the sense amplifier rows through a column (Y) switching circuit consisting of MOSFETs Q1 and Q2. The gates of the MOSFETs Q1 and Q2 are connected to a column select line YS. When the column select line YS is set to a select level (high level), the column select line YS assumes an on state, thereby connecting the input/output nodes of the sense amplifier SA to the local input/output lines SIO0T and SIO0B. Adjacent bit lines are also connected to the local input/output lines SIO0T and SIO0B through a similar switching circuit the switching of which is controlled by the same column select line YS.

Consequently, the input/output nodes of the sense amplifier SA are able to amplify a very small voltage change with respect to a half precharging voltage at the bit line which changes in correspondence with the storage potential of the memory cell connected to a point of intersection with the word line of the selected one of the two subarrays (e.g., MAT0 and MAT1) provided with the sense amplifier SA placed therebetween, by using as a reference voltage the half precharging voltage at the bit line on the nonselected subarray side. As a data signal on the complementary bit line, one selected by the column select line YS is imparted to the local input/output lines SIO0T, SIO0B and SIO1T and SIO1B through the column switching circuit (Q1 and Q2) and the like.

As shown in FIG. 1 referred to above, the local input/output lines SIO0T, SIO0B and SIO1T and SIO1B extend over the sense amplifier rows arranged in the direction of extension of the main word line. A signal amplified through a subamplifier circuit is imparted to the main amplifier provided in the main word driver MWD portion through the main input/output line extending in the same direction as that of the local input/output line, and is output in parallel in units of 16 bits in correspondence with the number of divisions of the subarray in one memory array which is formed by being divided into, for example, four sections on the memory chip. The memory arrays formed by being divided into four sections are respectively arranged to form memory banks, as will be described later.

Figure 4:
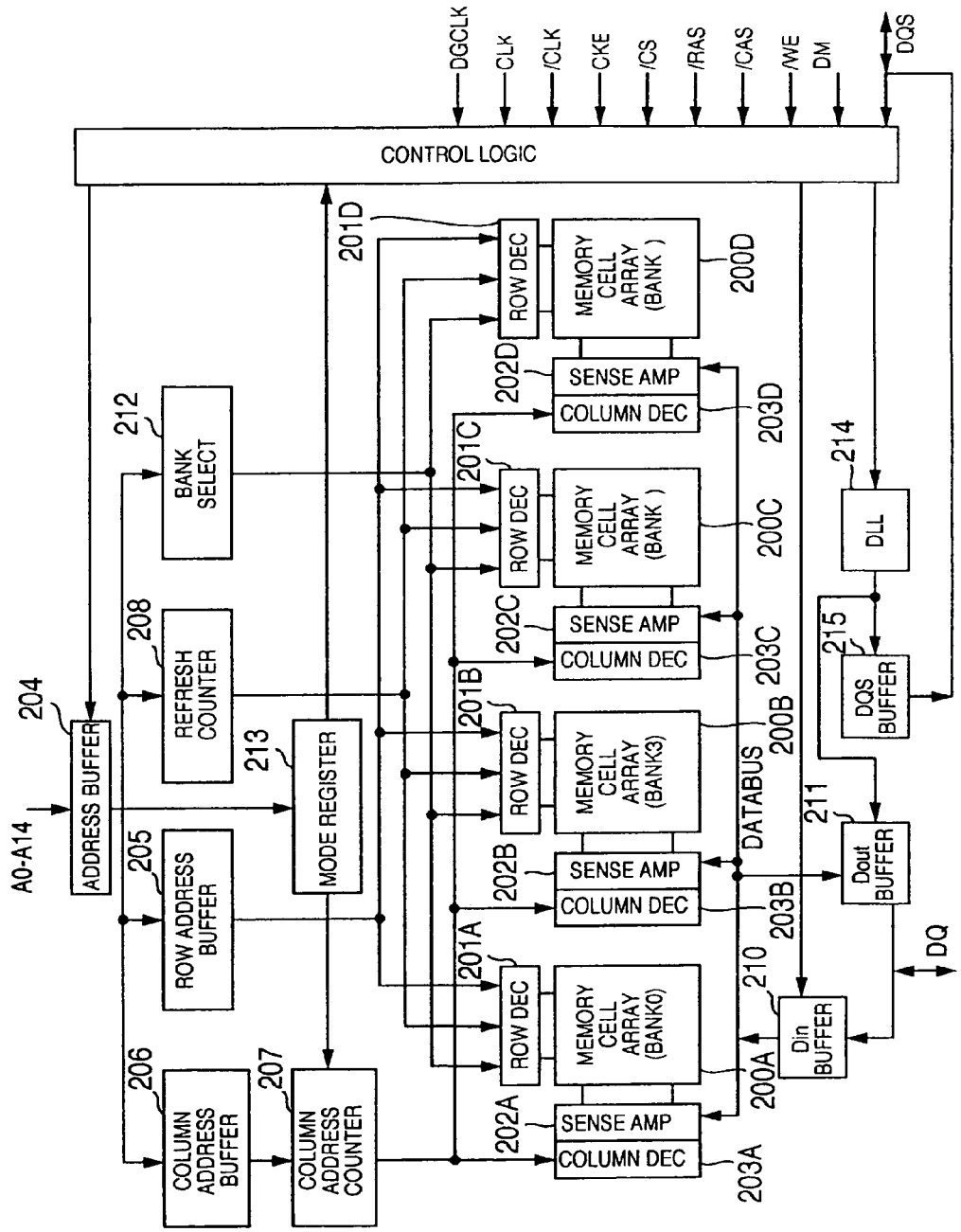
FIG. 4 is a block diagram illustrating an embodiment of the dynamic RAM in accordance with the invention.

FIG. 4 shows a block diagram of an embodiment of the dynamic RAM in accordance with the invention. The dynamic RAM in this embodiment is used as a double data rate synchronous dynamic random access memory (DDR SDRAM). The DDR SDRAM in this embodiment is provided with four memory arrays 200A to 200D in correspondence with the four memory banks although this arrangement is not particularly restricted. The memory arrays 200A to 200D respectively corresponding to the four memory banks 0 to 4 have therein dynamic memory cells arranged in matrix form. In accordance with the drawing, selection terminals of the memory cells arranged in the same column are connected to the word lines (not shown) of each column, and data input/output terminals of the memory cells arranged in the same row are connected to complementary data lines (not shown) for each row.

As for the unillustrated word lines of the above-described memory array 200A, one word line according to the result of decoding of a row address signal by a row decoder (Row DEC) 201A is driven to the select level. Unillustrated complementary data lines of the memory array 200A are connected to I/O lines of a sense amplifier (Sense AMP) 202A and a column decoder (Column DEC) 203A. The sense amplifier 202A is an amplifier circuit for detecting and amplifying very small potential differences appearing at the respective complementary data lines upon reading of data from the memory cell. The column decoder 203A includes a switching circuit for individually selecting the complementary data line and establishing continuity with the complementary input/output line. The column switching circuit is selectively operated in accordance with the result of decoding of the column address signal by the column decoder 203A.

The memory arrays 200B to 200D are also provided with row decoders 201B to 201D, sense amplifiers 203B to 203D, and column decoders 203B to 203D, respectively. The aforementioned complementary input/output lines are made common to the memory banks, and connected to an output terminal of a data input circuit (Din Buffer) 210 having a write buffer and to an input terminal of a data output circuit (Dout Buffer) 211 including a main amplifier. A terminal DQ is arranged as a data input/output terminal for inputting or outputting data D0 to D15 of 16 bits although the number of bits is not particularly restricted. A DQS buffer 215 forms a data strobe signal of data which is outputted from the aforementioned terminal DQ at the time of read operation.

Address signals A0 to A14 supplied from an address input terminal are time series signals including row address signals and column address signals. Of the address signals which are temporarily held in an address buffer 204 and are inputted in a time series, the row address signals are held in a row address buffer 205, and the column address signals are held in a column address buffer 206. A refresh counter 208 generates a row address at the time of automatic refreshing and self refreshing.

In a case where the illustrated RAM has a storage capacity of, for example, 256 M bits, an address terminal for inputting the address signal A14 is provided to permit memory access in units of 2 bits. Address signals are valid up to the address signal A11 in a x4-bit configuration, up to the address signal A10 in a x8-bit configuration, and up to the address signal A9 in a x16-bit configuration. In the case of a storage capacity of such as 64 M bits, address signals are valid up to the address signal A10 in the x4-bit configuration, up to the address signal A9 in the x8-bit configuration, and up to the address signal A8 in the x16-bit configuration as shown in the drawing.

An output of the column address buffer 206 is supplied as preset data to a column address counter 207. In a burst mode designated by such as a command which will be described later, the column address counter 207 outputs to the column decoders 203A to 203D column address signals serving as the aforementioned preset data or consecutively incremented values of these column address signals.

A mode register 213 holds various operation mode information. As for the aforementioned row decoders 201A to 201D, only the one which corresponds to the bank designated by a bank select circuit 212 operates and effects the selecting operation of the word line. Supplied to a control circuit (Control Logic) 209 are external control signals including clock signals CLK and /CLK (the symbol '/' means that the signal with the symbol affixed thereto is a row enable signal), a quick enable signal CKE, a chip select signal /CS, a column address strobe signal /CAS, a row address strobe signal /RAS, a write enable signal /WE, and the like, as well as /DM, DQS, and an address signal through the mode register 213, although this configuration is not particularly restricted. On the basis of level changes and timings of these signals, the control logic 209 forms internal timing signals for controlling the operating mode of the DDR SDRAM and the operation of the aforementioned circuit blocks, and has input buffers corresponding to the respective signals.

The clock signals CLK and /CLK are inputted to a delayed lock loop (DLL) circuit 214 through a clock buffer, and an internal clock is generated by that circuit 214. This internal clock is used as an input signal for the data output circuit 211 and the DQS buffer 215 although this configuration is not particularly restricted. In addition, the clock signal transmitted through the aforementioned clock buffer is supplied to a clock terminal for supply to the data input circuit 210 and the column address counter 207.

Other external input signals are made significant in synchronism with a leading edge of the relevant internal clock signal. The chip select signal ICS instructs at its low level the start of a command input cycle. An input when the chip select signal ICS is at high level (i.e., in the state of nonselection of the chip) and other inputs are insignificant. However, the internal operation such as the state of selection of the memory bank and the burst operation is not affected by a change in the state of nonselection of the chip. The signals /RAS, /CAS, and /WE function differently from corresponding signals in an ordinary DRAM, and are used as significant signals when a command cycle which will be described later is defined.

The clock enable signal CKE is a signal for instructing the validity of a next clock signal, and the leading edge of the next clock signal CLK is valid if the signal CKE is at high level, and is invalid if the signal CKE is at low level. It should be noted that, in a read mode, in a case where an external control signal /OE is provided for effecting output enable control for the data output circuit 211, the signal /OE is also supplied to the control circuit 209, and in a case where that signal is at high level, the data output circuit 211 is set in a state of high output impedance.

The aforementioned row address signal is defined by the levels of A0 to A11 in a row address strobe/bank active command cycle which is synchronized with the leading edge of the clock signal CLK (internal clock signal) and which will be described later.

The address signals A12 and A13 are regarded as bank select signals in the aforementioned row address strobe/bank active command cycle. Namely, one of the four memory banks 0 to 3 is selected by the combination of A12 and A13. Control of the selection of the memory bank can be effected by processing such as the activation of only the row decoder on the selected memory bank side, total nonselection of the column switch circuits on the nonselected memory bank side, and connection of only the selected memory bank side to the data input circuit 210 and the data output circuit although such processing is not particularly restricted.

In the case of 256 M bits in the x16-bit configuration as described above, the aforementioned column address signal is defined by the levels of A0 to A9 in the read or write command (a column address read command or a column address write command which will be described later) cycle which is synchronized with the leading edge of the clock signal CLK (internal clock). Further, the column address thus defined is set as a start address in a burst access.

In the DDR SDRAM, when the burst operation is being effected in one memory bank, if another memory bank is designated in the course of that operation and a row address strobe/bank active command is supplied, the operation of a row address system in that other memory bank is allowed without affecting the operation of the one memory bank executing the burst operation.

Accordingly, unless the data D0 to D15 collide with each other at the data input/output terminal of, for example, 16 bits, during the execution of a command whose processing has not been completed, it is possible to start the internal operation in advance by issuing a precharge command and a row address strobe/bank active command to a memory bank which is different from the memory bank subject to the processing of the command being executed. As described above, the DDR SDRAM in this embodiment effects memory access in units of 16 bits, has approximately 4 M addresses through addresses A0 to A11, and is configured by four memory banks. Therefore, the DDR SDRAM as a whole is arranged to have a storage capacity of approximately 256 M bits (4 M×4 banks×16 bits).

The detailed read operation of the DDR SDRAM is as follows. The respective signals including chip select /CS, row address strobe /RAS, column address strobe /CAS, and write enable /WE are inputted in synchronism with the CLK signal. At the same time as /RAS=0, the row address and the bank select signal are inputted, and are respectively held in the row address buffer 205 and the bank select circuit 212. The row decoder 210 of the bank designated by the bank select circuit 212 decodes the row address signal, and the data in the entire row are outputted from the memory cell array 200 as very small signals. The outputted very small signals are amplified and held by the sense amplifier 202. The designated bank becomes active.

After 3 CLK from the input of the row address, at the same time as CAS=0, the column address and the bank select signal are inputted, and are respectively held in the column address buffer 206 and the bank select circuit 212. If the designated bank is active, the column address being held is outputted from the column address counter 207, and the column decoder 203 selects a column. The selected data are outputted from the sense amplifier 202. The data outputted at this time are a two-set portion (8 bits in the x4-bit configuration and 32 bits in the x16-bit configuration).

The data outputted from the sense amplifier 202 are outputted outside the chip from the data output circuit 211 through data bus. The output timing is synchronized with both leading and trailing edges of QCLK outputted from DLL 214. At this time, the two-set portion of data is converted from parallel to serial, and is converted to data of one set portion x2. At the same time as the data output, the data strobe signal DQS is outputted from the DQS buffer 215. In a case where the burst length being held in the mode register 213 is 4 or greater, the column address counter 207 automatically increments the address, and reads the data in the next column.

The aforementioned DLL 2214 in terms of its function generates the operation clock for the data output circuit 211 and the DQS buffer 215. It takes time for the data output circuit 211 and the DQS buffer 215 from the time the internal clock signal generated by the DLL 214 is inputted thereto until the data signal and the data strobe signal are actually outputted therefrom. For this reason, the phases of the data signal and the data strobe signal are made to coincide with the external clock CLK by advancing the phases of the data signal and the data strobe signal ahead of the external CLK by using an appropriate replica circuit. Accordingly, in cases of other than the above-described data output operation, the DQS buffer is set in the state of high output impedance.

At the time of the write operation, since the DQS buffer 215 of the DDR SDRAM is in the state of high output impedance, the data strobe signal DQS is inputted to the terminal DQS from a data processor such as a microprocessor, and the write data synchronized therewith are inputted to the terminal DQ. The data input circuit 210 fetches the write data inputted from the terminal DQ in the above-described serial form by means of the clock signal formed on the basis of the data strobe signal inputted from the terminal DQS, and converts serial write data into parallel data in synchronism with the clock signal CLK. The parallel data are transmitted to the selected memory bank through the data bus, and are written in the selected memory cell in the memory bank.

In this embodiment, a clock terminal DGCLK used exclusively for testing is provided for the above-described high-speed DDR SDRAM to enable the testing of its high-speed operation equivalent to its actual operation by using a low-speed testing apparatus. Apart from being provided as an external terminal of a semiconductor integrated circuit device, this clock terminal used exclusively for testing may be formed by a mere probing electrode capable of supplying a testing clock signal at least in a probing process. An internal circuit of the control circuit 209 related to the clock DGCLK used exclusively for testing may be formed in the same way as a corresponding circuit of an embodiment which will be described later with reference to FIG. 6.

Figure 5:
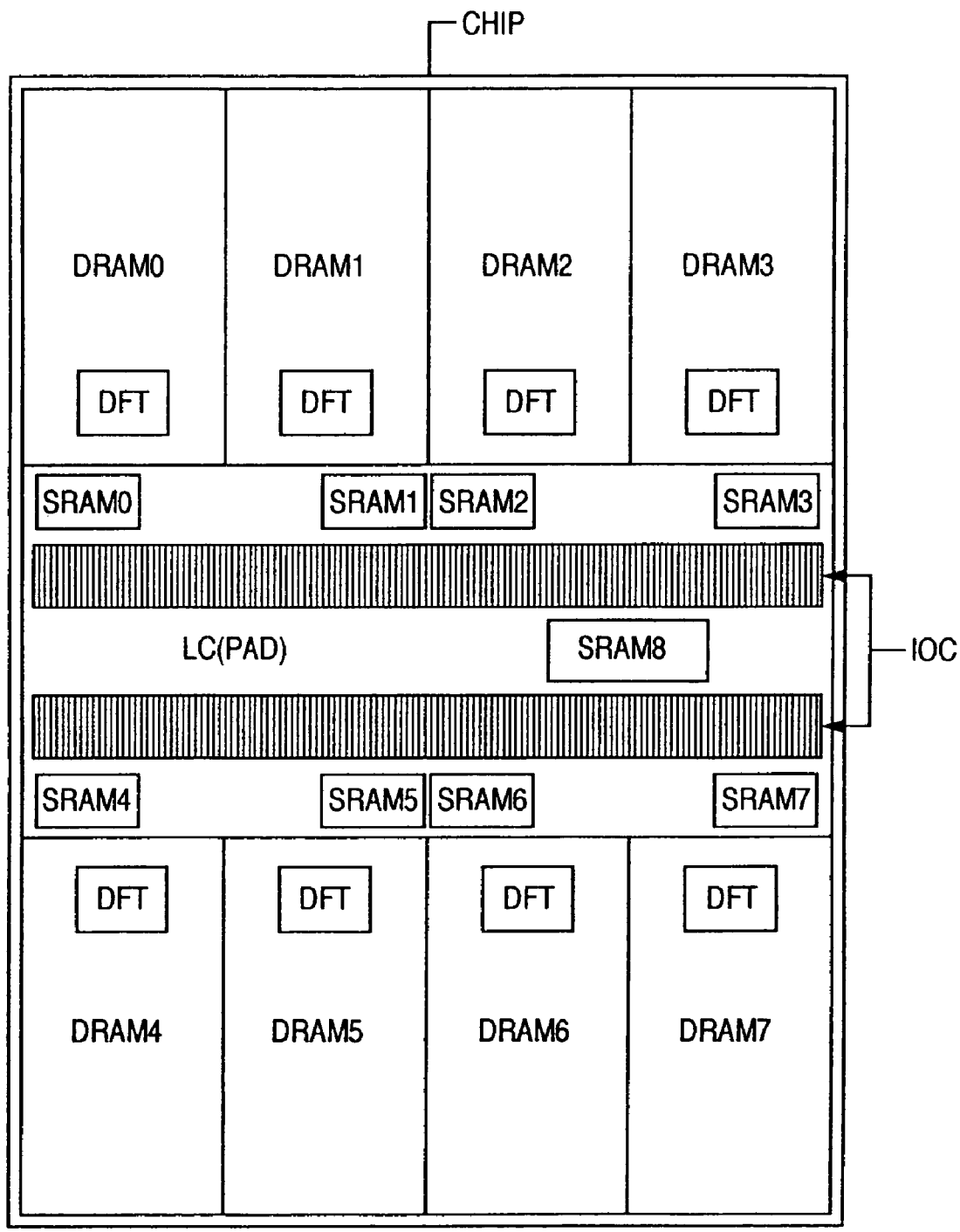
FIG. 5 is a substrate layout diagram illustrating an embodiment of a logic embedded memory integrated circuit to which the invention is applied.

FIG. 5 shows a substrate layout diagram of an embodiment of a logic embedded memory integrated circuit to which the invention is applied. With reference to the drawing, a description will be given of an outline of the block configuration and the substrate layout of the logic embedded memory integrated circuit in accordance with this embodiment. It should be noted that the logic embedded memory integrated circuit of this embodiment is mounted on a predetermined board of a computer system and constitutes its cash memory, for example, although this arrangement is not particularly restricted. In addition, in the following description concerning the substrate layout of the logic embedded memory integrated circuit, the upper and lower and left and right directions on a semiconductor substrate CHIP surface are represented by the positional relationship shown in FIG. 5.

In FIG. 5, the logic embedded memory integrated circuit of this embodiment comprises four functional blocks, i.e., DRAM macro cells DRAM 0 to DRAM 3, which are disposed on the upper side of the semiconductor substrate CHIP, as well as four DRAM macro cells DRAM 4 to DRAM 7, which are disposed on the lower side thereof, although this arrangement is not particularly restricted. Each of these DRAM macro cells has a design-for-testability (DFT) circuit and has a storage capacity of 64 killowords (KW)×288 b (bits), which is not particularly restricted.

The logic embedded memory integrated circuit further comprises eight SRAM macro cells SRAM 0 to SRAM 7, which are respectively disposed on the inner sides of the DRAM macro cells, as well as one SRAM macro cell SRAM 8 which is disposed on a central portion of the semiconductor substrate CHIP. A multiplicity of input/output cells IOCs are arranged in column form on the inner sides of the SRAM macro cells SRAM 0 to SRAM 3 and SRAM 4 to SRAM 7 along the horizontal center line of the semiconductor substrate CHIP. A logic unit LC including a multiplicity of unillustrated gate arrays and pads PADs corresponding to chip terminals is disposed between these input/output cells IOCs and SRAM macro cells. The gate arrays of the logic unit LC are combined in accordance with user specifications and constitute predetermined logic circuits. In addition, the pads PADs are connected to corresponding bumps through interconnection layers formed in the package, and constitute contact terminals for connecting a testing apparatus when a probe test is performed concerning the access evaluation of the DRAM macro cells of the logic embedded memory integrated circuit.

The configuration of the DRAM macro cells in this embodiment is similar to that of the embodiment shown in FIGS. 1 to 3. However, as for the arrangement of the bit lines, the above-described one-crosspoint method may be adopted, or a two-crosspoint method in which a pair of complementary bit lines are extended in parallel may be adopted. In this two-crosspoint method, it is possible to adopt a shared sense amplifier method in which the complementary bit lines provided on both sides of one sense amplifier are selectively connected in the read and write operation with respect to its memory cell.

In the DRAM macro cells of this embodiment, although this arrangement is not particularly restricted, during the test operation desired test data can be serially inputted from a scan-in terminal to the latches and buffers of the DRAM macro cells, and the data held in the latches or buffers can be serially outputted through a scan-out terminal, thereby making it possible to efficiently perform the test diagnosis of DRAM macro cells. Namely, when the DRAM macro cells are set in a test mode for the test diagnosis, the held data or the scan-in data inputted serially from the macro cell input terminal are consecutively shifted in accordance with an internal scan clock signal, and transmitted to output data latches.

Figure 6:
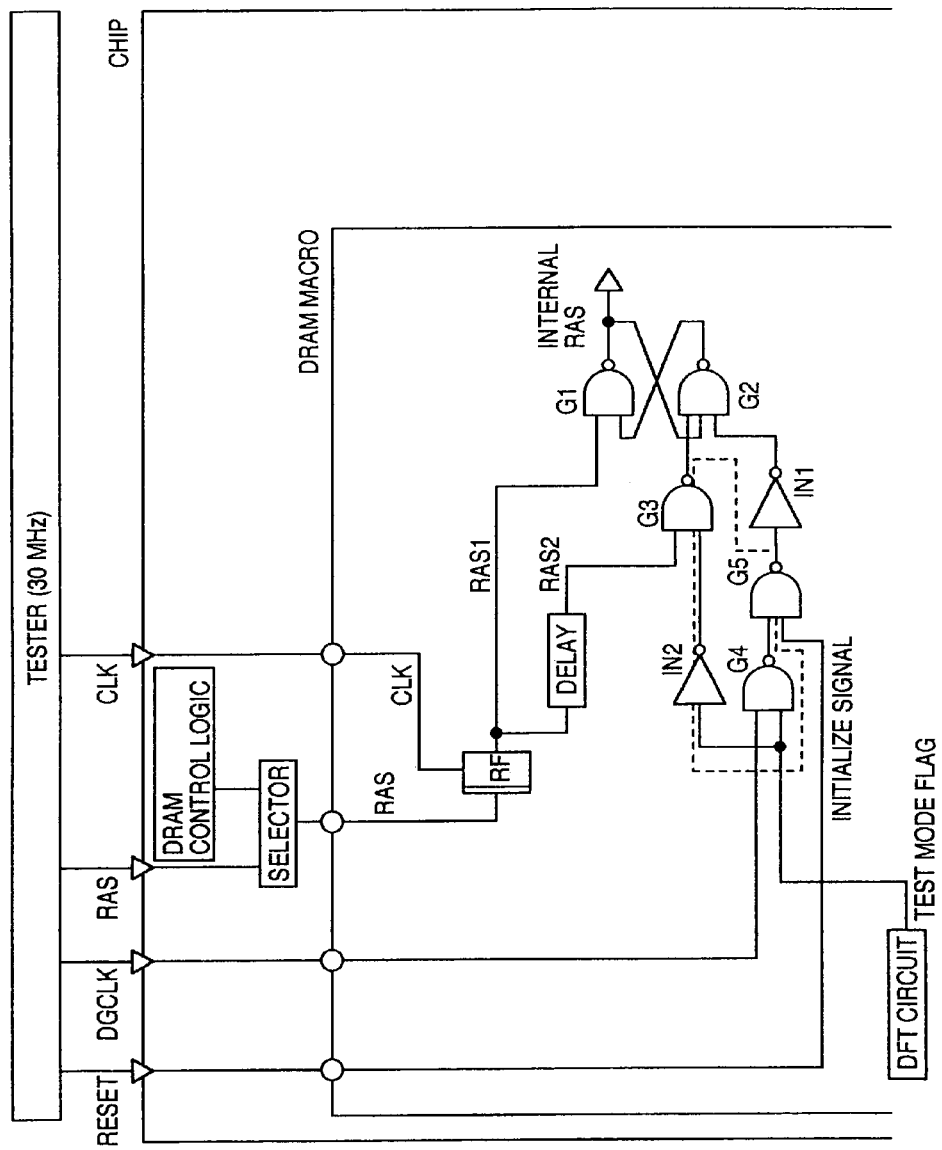
FIG. 6 is a circuit diagram schematically illustrating an example of an internal RAS generating circuit of the logic embedded memory integrated circuit in accordance with the invention

FIG. 6 shows a schematic circuit diagram of an example of an internal RAS generating circuit of the logic embedded memory integrated circuit in accordance with the invention. In the drawing, a tester is also shown by way of illustrative example. When the logic embedded memory integrated circuit is set in the normal operating mode, a selector selects a signal formed by the DRAM control logic, and supplies it to the RAS terminal of the DRAM macro cell. Similar selectors are provided for other terminals as well, and input of other signals RAS, WE and the like constituting the commands, input of the address signal, and input of write data are made from the DRAM control logic, while the read signal is transmitted to the DRAM control logic.

When the logic embedded memory integrated circuit is set in a test mode for the access evaluation of the DRAM macro cells, the selector transmits the signal RAS from the tester to the DRAM macro cell. The same applies to the other similar control signals RAS, WE and the like. It should be noted that, as the clock signal CLK, the clock signal which is supplied to the semiconductor integrated circuit device (chip) can be used as it is. In other words, during the normal operation, a high-speed clock signal (e.g., 333 MHz) corresponding to that operation is supplied. In the test mode, a clock signal (approximately 30 MHz) slower than that of the aforementioned normal operation is supplied from the tester.

As a result, in the test mode, the operation of the DRAM macro cell becomes slower due to such a slow-speed clock, so that the response characteristics of the circuit described above cannot be evaluated. Accordingly, the internal RAS generating circuit is formed by the following circuit so as to be provided with a testing function. The RAS signal is fetched into a flip-flop circuit FF which operates at the clock signal CLK. A signal RAS1 fetched into this flip-flop circuit FF is formed as a set signal of a latch circuit formed by using two logic circuits G1 and G2 of a NAND configuration for forming the internal RAS signal. A signal RAS2 obtained by delaying this signal RAS1 by a delay circuit Delay is inverted through a logic circuit G3 of the NAND configuration, and is used as a reset signal for resetting the aforementioned latch circuit (G1, G2).

Consequently, as shown in a timing chart in FIG. 7, during the normal operation, the internal RAS formed by the aforementioned latch circuit (G1, G2) starts the memory selecting operation by activating the internal RAS (a change to high level) by the active level (a change from high level to low level) fetched in synchronism with CLK, and terminates the memory selecting operation by deactivating the internal RAS by the inactive level (a change from low level to high level) of the signal RAS2 formed by delaying by the delay circuit Delay the inactive level (a change from low level to high level) of the RAS signal fetched in synchronism with CLK. The aforementioned delay circuit Delay is provided for adding a delay time TD to the time duration when the RAS signal synchronized with the clock signal CLK changes from the active level to the inactive level in the memory operation period. The delay time is set in one period of the clock signal CLK as the period of memory selecting operation.

However, with this circuit alone, if an attempt is made to effect operation with the clock signal corresponding to the performance of the tester, the memory operation period becomes long in correspondence with the period of the frequency of the clock signal CLK, and the time from the termination of the memory operation period until an ensuing memory access start similarly becomes long. Hence, in the test mode, it is impossible to effect the memory selecting operation and precharging operation equivalent to those during the above-described normal operation.

In this embodiment, a clock terminal used exclusively for testing is provided, and a logic circuit G4 of the NAND configuration is provided to which is supplied the clock signal DGCLK for testing supplied from that clock terminal used exclusively for testing and whose gate is controlled by a test mode flag supplied from the aforementioned DFT circuit. Its output signal and a reset signal RESET are inputted as reset signals to the aforementioned latch circuit through a logic circuit G5 of the NAND configuration and an inverter circuit IN1. To prevent the aforementioned latch circuit (G1, G2) from becoming reset by the signal RAS2 in the test mode, the test mode flag is inverted by an inverter circuit IN2 to control the logic circuit G3 and fix its output signal at high level irrespective of the signal RAS2, thereby stopping the reset operation of the latch circuit (G1, G2) by the signal RAS2.

The aforementioned reset signal RESET is a signal for initializing the registers and latches of the logic circuits such as the DRAM control logic when power is supplied to the logic embedded memory integrated circuit or by a reset signal from the host side. The reset signal REST is also inputted to the latch circuit (G1, G2) of the DRAM macro cell for the purpose of its initialization. For this purpose, as the circuits to be added in this application, it suffices to merely add the clock terminal (DGCLK) used exclusively for testing as well as the latch circuits G3 to G5 and the inverter circuit IN2 indicated by the dotted lines in the drawing.

As shown in the timing chart in FIG. 7, in the test mode, the internal RAS formed in the latch circuit (G1, G2) is able to start the memory selecting operation by activating the internal RAS (a change to high level) by the active level (a change from high level to low level) fetched in synchronism with CLK, and is able to terminate the memory selecting operation by deactivating the internal RAS by the active level (a change from high level to low level) of the clock signal DGCLK used exclusively for testing instead of the aforementioned signal RAS2. It should be noted that when the initialization signal is set to the low-level activation level, the latch circuit (G1, G2) is unconditionally reset.

In this embodiment, although in the normal mode the internal RAS is generated by the RAS signal inputted from the outside and the delay circuit Delay in the chip as described above, if entry is made to the test mode of the invention by the DFT circuit, the reset timing of the internal RAS can be freely controlled by changing the phase of the clock DGCLK used exclusively for testing. In accordance with this embodiment, it becomes possible to control and test the write time tRWL and the bit-line precharge time tPR by such simple circuitry and in a single mode.

FIGS. 8A and 8B show operation waveform diagrams for explaining the invention. The drawings are for a write failure test, and the word line WL and the bit line BL are shown by superposing their signal levels to clarify their time relationship. As shown in FIG. 8A, in the actual operation (an example of 333 MHz is shown here), since one clock cycle is as short as 3 ns, in the case of a large bit (memory cell) in which the resistance of the memory cell contact is large as described above, it takes time for the storage node to assume the same potential as that of the bit line as shown by the dotted lines in the drawing, and the word line falls before full write and terminates writing. Consequently, a sufficient amount of bit line signal cannot be obtained in the next read cycle, resulting in a failure.

On the other hand, in the low-speed operation (an example of 33 MHz is shown here) using the tester in the probing inspection (P inspection), as shown in FIG. 8B, since the clock cycle is as long as 30 ns, even if a faulty bit cell with a large parasitic resistance is present, the word line WL is made to fall after waiting for a sufficiently long time until that faulty bit cell is fully written in, so that a failure does not occur. In the P inspection in a wafer state, faulty bits are extracted and are replaced by redundant cells to effect remedy, but since the test cycle is slow in the vicinity of 33 MHz, these faulty bits cannot be remedied. Since the failure can be ascertained for the first time only by actual operation in screening, faulty chips are uselessly assembled and screened, so that the number of wasteful processes increases, thereby remarkably lowering the yield.

In the DRAM and the DRAM macro cell in this embodiment, by using the test mode, the fall timing of the word line WL is changed over from an edge trigger of the normal clock (CLK) to an edge trigger of the clock (DGCLK) used exclusively for testing, whereby, as shown by the dotted lines in the drawing, in the low-speed test as well, the word line WL is made to fall at the same timing as that in the actual high-speed operation, and the fall time of the word line WL is advanced by a time TW, so that the write time is set to the same as that during the above-described actual operation to permit the test. Thus such faulty bits can be detected and can be remedied in the wafer state.

FIGS. 9A and 9B show operation waveform diagrams for explaining the invention. The drawings are for a bit-line precharge time failure test, and the word line WL and the bit line BL are shown by superposing their signal levels to clarify their time relationship in the same way as described above. As shown in FIG. 9A, in the actual operation (an example of 333 MHz is shown here), since one clock cycle is as short as 3 ns, in the bit line in which precharging is slow due to the large contact resistance and a large threshold voltage Vth of the precharging MOSFET as described above, precharging does not terminate until the next read cycle begins, and the amount of bit line signal for reading is destroyed, resulting in a failure.

On the other hand, in a case where the RAM is subjected to low-speed operation (an example of 33 MHz is shown here) using the tester in the probing inspection (P inspection), as shown in FIG. 9B, since the clock cycle is as long as 30 ns, the word line in the next read cycle is caused to rise after being completely precharged even in such a bit line with slow precharging, so that no failure occurs. In this case as well, the faulty bits cannot be remedied in the same way as during the write time tRWL, and since the failure can be ascertained for the first time only by actual operation in screening, the yield is remarkably lowered.

In the DRAM and the DRAM macro cell in this embodiment, by using the same test mode as that during the aforementioned write time tRWL, the fall timing of the word line WL is changed over from an edge trigger of the normal clock (CLK) to an edge trigger of the clock (DGCLK) used exclusively for testing, whereby, as shown by the dotted lines in the drawing, in the low-speed test as well, the word line WL is made to fall at the same timing as that in the actual high-speed operation by delaying the fall time of the word line WL by a time TP, so that the bit-line precharge time is set to the same as that during the high-speed operation to permit the test. Thus such faulty bits can be detected and can be remedied in the wafer state.

Figure 10:
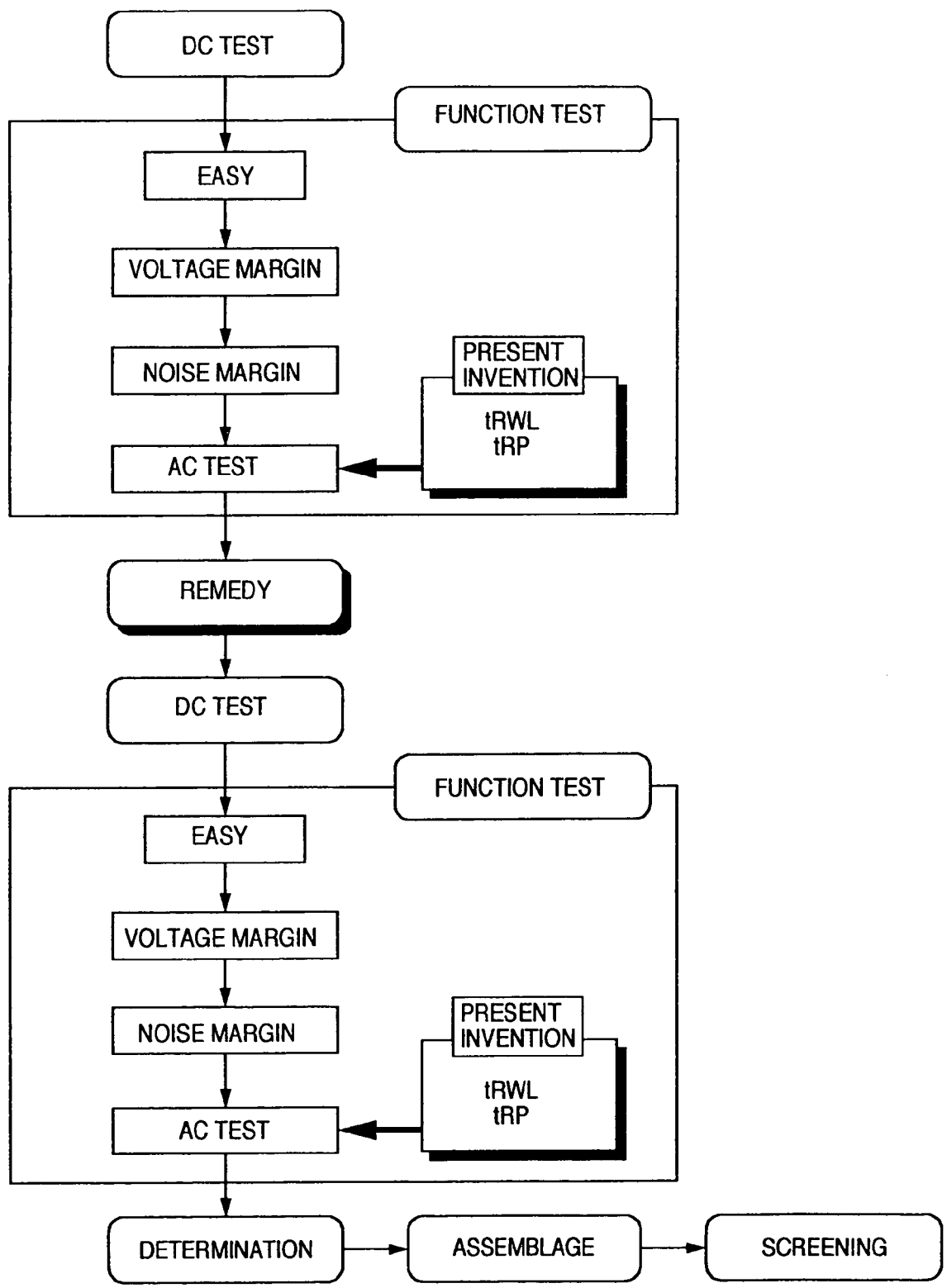
FIG. 10 is a flowchart illustrating an embodiment of a method of manufacturing a semiconductor integrated circuit device in accordance with the invention.

FIG. 10 shows a flowchart of an embodiment of the method of manufacturing a semiconductor integrated circuit device in accordance with the invention. A semiconductor integrated circuit device having a memory circuit and its remedy circuit, which will be described later, is formed on a wafer. Normally, testing first begins with a test on direct-current (d.c.) characteristics, proceeds to a functional test starting with easy patterns and consecutively proceeding to stringent patterns. Although the failures can be sufficiently screened out even in the low-speed clock test using a tester up until a noise margin test, those items for which the failure is detected only when the circuit is operated at the high-speed clock are tested in alternate-current (a.c.) tests, and the write time test and the precharge time test which are shown in FIGS. 8A and 8B and FIGS. 9A and 9B in the test mode to which the invention is applied are carried out.

An access time test is included as an a.c. test other than the write time test and the precharge time test mentioned above. Faulty addresses are extracted from all the results of the functional test to effect remedy. Since the aforementioned write time failure is the failure of the memory cell itself, it is relived by a switch to a redundant word line or a redundant bit line, while since the aforementioned precharge failure is a bit line failure, a switch to the redundant bit line is carried out.

To confirm the possibility of the above-described remedy, the same tests are performed, i.e., the d.c. test is performed and, in the functional test testing begins with easy patterns and consecutively proceeds to stringent patterns, and the voltage margin and noise margin tests are performed. Further, the write time test and the precharge time test which are shown in FIGS. 8A and 8B and FIGS. 9A and 9B in the test mode to which the invention is applied are carried out to confirm the above-described remedy. When the all bit pass is confirmed, the probe test is finished. Subsequently, assembly and screening are carried out for shipment.

In the manufacturing process in this embodiment, since those chips which are faulty in the state of actual operation are excluded in the assembly and screening, there are no wastes in the assembly and screening, so that the screening yield can be increased. In addition, since there is no need to develop a special high-speed tester for detecting such defective chips, the a.c. tests can be carried out at low cost. It should be noted that the test mode in accordance with the invention of this application may be utilized to independently evaluate only the write time tRWL during screening as well.

Figure 11:
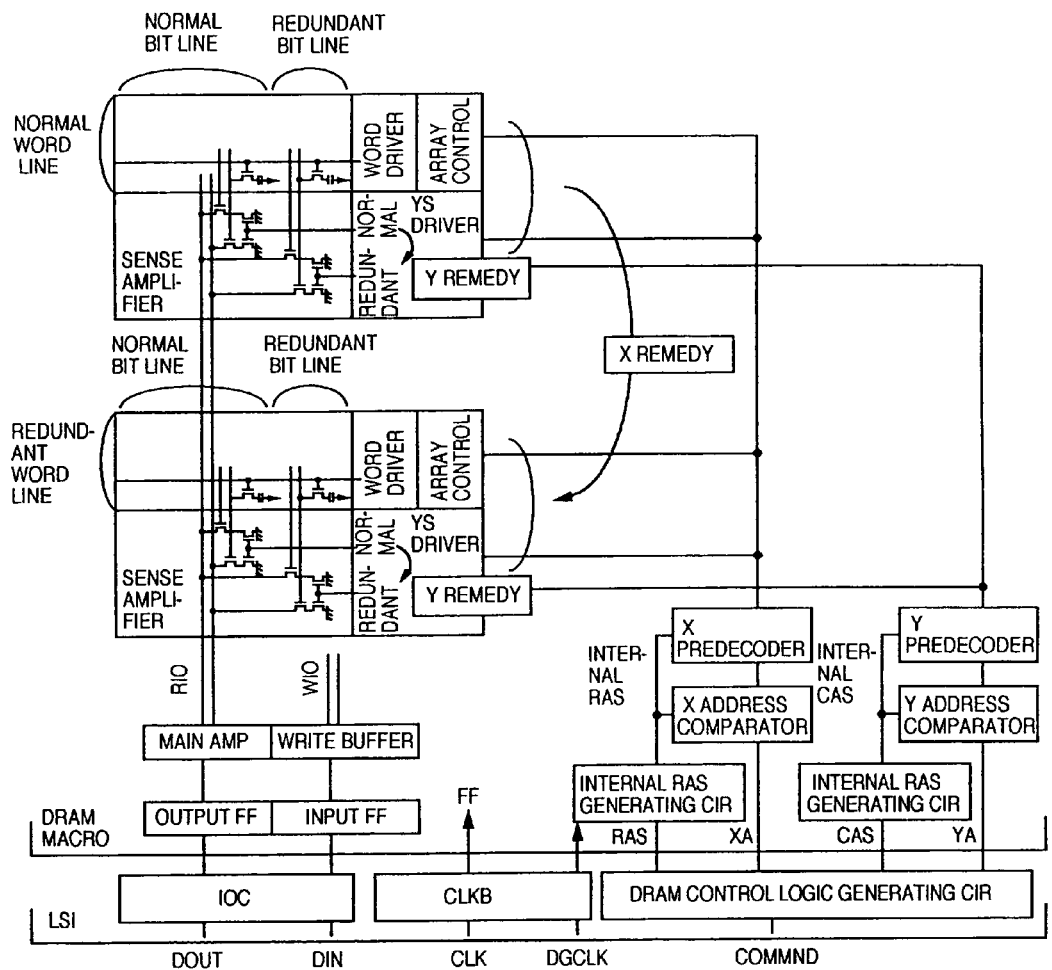
FIG. 11 is a schematic block diagram of an embodiment of a DRAM macro cell in accordance with the invention.
Figure 12:
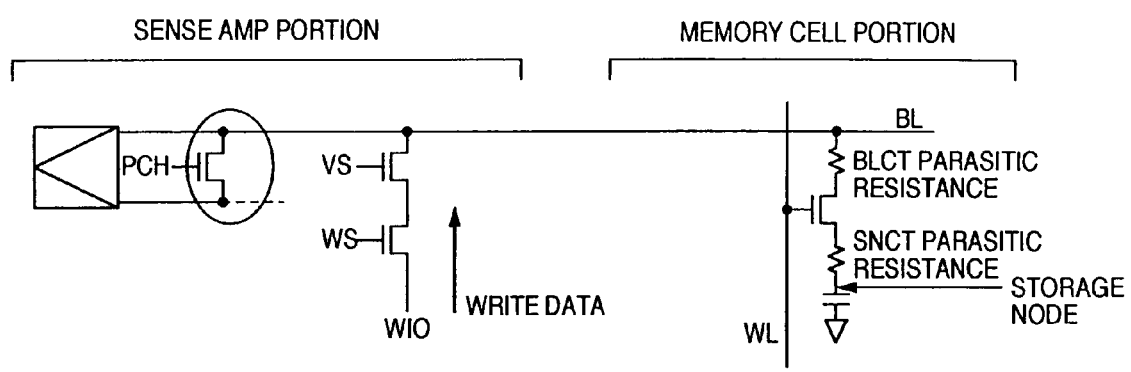
FIG. 12 is an equivalent circuit diagram of a memory cell portion and a sense amplifier portion of a DRAM.

FIG. 11 shows a schematic block diagram of an embodiment of a DRAM macro cell in accordance with the invention. In the general-purpose DRAM shown in FIG. 1 as well, a similar remedy circuit is provided. This embodiment is directed toward the remedy circuit for the word line and the bit line. The memory array has redundant word lines and redundant bit lines in addition normal bit lines and normal word lines. The redundant bit lines are provided for the respective memory arrays, while as for the redundant word lines, one redundant word line is collectively provided for a plurality of memory arrays. In this case, the redundant word line is allotted to the plurality of memory arrays whose input/output lines (RIO and WIO) connected to the main amplifier and the write buffer are common such that the redundant word line can be shared.

An X-address comparator and a Y-address comparator respectively store faulty addresses corresponding to the faulty word line and the faulty bit line, and if address signals XA and YA corresponding to such a faulty word line and a faulty bit line are inputted thereto, the X-address comparator and the Y-address comparator inhibit an X predecoder and a Y predecoder from effecting the operation of selecting the faulty word line and the faulty bit line, and implements X remedy and Y remedy in which the faulty word line and the faulty bit line are replaced by the redundant word line and the redundant bit line.

A DRAM control logic generating circuit of the semiconductor integrated circuit device LSI forms such as RAS and CAS for constituting the aforementioned commands COM-MANDs as well as the address signals XA and YA for accessing the DRAM macro cell. In addition to the clock signal CLK for normal operation, the clock DGCLK for testing which is used in the test mode is inputted to a clock buffer CLKB. This click DGCLK is supplied to the internal RAS generating circuit including the circuitry shown in FIG. 6, and is used for the test mode such as the one described above. An input/output circuit IOC effects the input of a write signal DIN and the output of a read signal DOUT.

The operation and advantages obtained from the above-described embodiments are as follows.

(1) The semiconductor integrated circuit device comprises: an internal circuit whose state of operation is controlled in response to an internal operation control signal; and a control circuit for forming the internal operation control signal, wherein the control circuit has its inputs connected to a terminal to which an external operation control signal is supplied and a terminal to which a timing signal used exclusively for testing is supplied, the control circuit being capable of providing control such that, in a test mode, the internal operation control signal is changed from a first state of control to a second state of control in response to a change of the external operation control signal from a first state to a second state, and the internal operation control signal is changed to the first state of control in response to the timing exclusively used for testing, and such that, in a normal operation mode, the internal operation control signal is changed from the first state of control to the second state of control in response to the change of the external operation control signal from the first state to the second state, and the internal operation control signal is changed to the first state of control in response to the change of the external operation control signal to the first state. Accordingly, advantages are offered in that a high-speed test equivalent to that in a state of actual operation is made possible by using a low-speed clock in a tester having a simple configuration, and that the test can be performed with high reliability.

(2) In addition to the above, the clock signal is set as a clock signal of a frequency lower than that at the time of the normal operation in correspondence with the performance of a testing apparatus in the test mode, and a phase difference of the timing signal for testing with the clock signal forms an internal operation control signal corresponding to the frequency of the clock signal at the time of the normal operation. Consequently, an advantage can be obtained in that it is possible to perform a test equivalent to that of high-speed operation corresponding to the state of actual operation by using a low-speed testing apparatus.

(3) As a method of testing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, a period of operation by the operation control signal is changed by using a timing signal of a frequency lower than that at the time of normal memory operation in correspondence with the performance of a testing apparatus, and by combining the timing signal at the time of the test operation with a timing signal used exclusively for testing, so as to test response characteristics of the memory circuit. Accordingly, an advantage can be obtained in that it is possible to obtain highly reliable test results corresponding to the state of actual operation.

(4) As a method of manufacturing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, the memory circuit having a defect remedy circuit, with respect to a semiconductor integrated circuit substrate on which the memory circuit and the defect remedy circuit are formed, response characteristics of the memory circuit are tested by controlling a period of operation of the memory circuit through a combination of the timing signal whose frequency is set to be lower than that at the time of normal operation in correspondence with the performance of the testing apparatus and a timing signal used exclusively for testing, and by controlling the period of operation. On the basis of a result of the test, the remedy of a defect in the memory circuit is determined, and remedy is provided by the defect remedy circuit. Consequently, an advantage can be obtained in that it is possible to increase the screening yield.

Although the invention made by the present inventors has been specifically described on the basis of the embodiments, the invention of this application is not to be limited to the embodiments, and it goes without saying that various modifications are possible within the range which does not depart from its gist. For example, in the memory cell and the precharging MOSFET, parasitic resistance at the contacts between the memory cell and the bit line is large as described above, and the invention is similarly applicable to those whose process variations are large. The interface of the DRAM is not limited to the DDR SDRAM such as the one described above, and can be widely used for those in which memory access is made in synchronism with the clock, such as an SDRAM. The invention can be used widely for a semiconductor integrated circuit device including the above-described memory cell, its testing method, and manufacturing method.

As described above, in accordance with the embodiments of the invention, the semiconductor integrated circuit device comprises: an internal circuit whose state of operation is controlled in response to an internal operation control signal; and a control circuit for forming the internal operation control signal, wherein the control circuit has its inputs connected to a terminal to which an external operation control signal is supplied and a terminal to which a timing signal used exclusively for testing is supplied, the control circuit being capable of providing control such that, in a test mode, the internal operation control signal is changed from a first state of control to a second state of control in response to a change of the external operation control signal from a first state to a second state, and the internal operation control signal is changed to the first state of control in response to the timing exclusively used for testing, and such that, in a normal operation mode, the internal operation control signal is changed from the first state of control to the second state of control in response to the change of the external operation control signal from the first state to the second state, and the internal operation control signal is changed to the first state of control in response to the change of the external operation control signal to the first state. Accordingly, a high-speed test equivalent to that in a state of actual operation is made possible by using a low-speed clock in a tester having a simple configuration, and that the test can be performed with high reliability.

As a method of testing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, a period of operation by the operation control signal is changed by using a timing signal of a frequency lower than that at the time of normal memory operation in correspondence with the performance of a testing apparatus, and by combining the timing signal at the time of the test operation with a timing signal used exclusively for testing, so as to test response characteristics of the memory circuit. Accordingly, it is possible to obtain highly reliable test results corresponding to the state of actual operation.

As a method of manufacturing a memory circuit which has a plurality of signal nodes to which an operation control signal for controlling memory selecting operation and an operation timing signal are supplied, and in which word-line selecting operation, sense amplifier operation following the word-line selecting operation, memory selecting operation including data transmitting operation, and the termination of the memory selecting operation including the termination of the word-line selecting operation are effected on the basis of the operation control signal, a reference timing of the internal operation of the memory circuit being set by the operation timing signal, the memory circuit having a defect remedy circuit, with respect to a semiconductor integrated circuit substrate on which the memory circuit and the defect remedy circuit are formed, response characteristics of the memory circuit are tested by controlling a period of operation of the memory circuit through a combination of the timing signal whose frequency is set to be lower than that at the time of normal operation in correspondence with the performance of the testing apparatus and a timing signal used exclusively for testing, and by controlling the period of operation. On the basis of a result of the test, the remedy of a defect in the memory circuit is determined, and remedy is provided by the defect remedy circuit. Consequently, it is possible to increase the screening yield.

What is claimed is:

1. A method of testing response characteristics of a memory circuit which has a plurality of signal nodes for receiving an operation control signal for controlling a memory selecting operation and an operation timing signal, and a word-line selecting operation, a sense amplifier operation following the word-line selecting operation, the memory selecting operation including a data transmitting operation, and the termination of the memory selecting operation including the termination of the word-line selecting operation being affected on the basis of an internal operation timing signal, the internal operation timing signal being generated based on the operation control signal, comprising the steps of:

lowering a frequency of the operation timing signal at the time of a test operation by a testing apparatus to a level lower than at the time of a normal memory operation in correspondence with the performance of said testing apparatus; and changing a period of the test operation of said memory circuit by the internal operation timing signal made by combining the operation control signal at the time of the test operation with a timing signal used exclusively for testing which is supplied externally into said memory circuit and changing a phase of the timing sianal to control a reset timing of the internal operation timing signal.

2. A method of testing according to claim 1, wherein said memory circuit has read/write memory cells, and effects the memory selecting operation based on the internal operation timing signal and an operation of writing data into one of said memory cells selected by the word-line selecting operation, and wherein the period of operation of said memory circuit is changed by changing an input timing of the timing signal used exclusively for testing, and the data write response characteristics of sad memory circuit are tested on the basis of the change of the period of operation of said memory circuit.

3. A method of testing according to claim 1, wherein upon termination of the memory selecting operation, said memory circuit effects sequential operations including the termination of the word-line selecting operation and a reset operation for resetting to a predetermined level the potential of a bit line to which data for a memory cell is imparted, and a period up to a change timing of the internal operation timing signal for starting next memory selecting operation is changed by changing an input timing of the timing signal used exclusively for testing, so as to test the response characteristics of the reset operation.

4. A method of manufacturing a memory circuit which has a plurality of signal nodes for receiving an operation control signal for controlling a memory selecting operation and an operation timing signal, and a word-line selecting operation, a sense amplifier operation following the word-line selecting operation, the memory selecting operation including a data transmitting operation, and the termination of the memory selecting operation including the termination of the word-line selecting operation being effected on the basis of on the basis of an internal operation timing signal, the internal operation timing signal being generated based on the operation control signal, said memory circuit having a defect remedy circuit, comprising;

a first step of preparing a semiconductor integrated circuit substrate on which said memory circuit and said defect remedy circuit are formed;

a second step of testing response characteristics of said memory circuit by a testing apparatus by setting a frequency of the internal operation timing signal to a level lower than that at the time of a normal operation in correspondence with the performance of said testing apparatus, by controlling a period of the test operation of said memory circuit through a combination of the operation control signal and a timing signal used exclusively for testing and changing a phase of the timing signal to control a reset timing of the internal operation timing signal, and by controlling the period of operation, the timing signal used exclusively for testing being supplied externally into said memory circuit;

a third step of determining a portion of said memory circuit whose defect is to be remedied on the basis of a result of the testing of the response characteristics; and a fourth step of remedying by said defect remedy circuit the portion whose defect is to be remedied as determined in the third step.

* * * * *